(12) United States Patent
Hung et al.

(10) Patent No.: US 6,728,086 B2
(45) Date of Patent: Apr. 27, 2004

(54) POWER-RAIL ELECTROSTATIC DISCHARGE PROTECTION CIRCUIT WITH A DUAL TRIGGER DESIGN

(75) Inventors: Kei-Kang Hung, Changhua Hsien (TW); Chien-Hui Chuang, Taipei Hsien (TW)

(73) Assignee: Faraday Technology Corp., Hsinchu (TW)

( * ) Notice: Subject to any disclaimer, the term of this patent is extended or adjusted under 35 U.S.C. 154(b) by 98 days.

(21) Appl. No.: 10/050,018

(22) Filed: Jan. 15, 2002

(65) Prior Publication Data

US 2003/0133237 A1 Jul. 17, 2003

(51) Int. Cl.[7] .................................. H02H 9/00
(52) U.S. Cl. ........................................ 361/56
(58) Field of Search .................. 361/56, 93.1, 111, 361/91.1; 257/355, 499, 373

(56) References Cited

U.S. PATENT DOCUMENTS 6,392,860 B1 * 5/2002 Lin et al. ..................... 361/111

6,455,902 B1 * 9/2002 Voldman ..................... 257/378

* cited by examiner

Primary Examiner—Ronald W. Leja
(74) Attorney, Agent, or Firm—J.C. Patents

(57) ABSTRACT

A power-rail ESD (electrostatic discharge) protection circuit with a dual trigger design is proposed, which is coupled between a first power line and a second power line connected to an IC device for protecting the IC device against ESD on the first power line and the second power line. The proposed power-rail ESD protection circuit comprises a control circuit and at least one MOS device. The control circuit is coupled between the first power line and the second power line, and which is capable of, in the event of ESD in the first power line and the second power line, being triggered by the ESD to output a substrate-triggering voltage and a gate-driving voltage to the MOS device, causing the MOS device to bypass the ESD current from the first power line and the second power line. The circuit configuration of the proposed power-rail ESD protection circuit can help reduce the junction breakdown voltage in a MOS device and increase in ESD robustness.

6 Claims, 8 Drawing Sheets

POWER-RAIL ELECTROSTATIC DISCHARGE PROTECTION CIRCUIT WITH A DUAL TRIGGER DESIGN

BACKGROUND OF THE INVENTION

1. Field of the Invention

This invention relates to ESD (electrostatic discharge) protection technology, and more particularly, to a power-rail ESD protection circuit with a dual trigger design.

2. Description of Related Art

In the fabrication of integrated circuits (IC), such as DRAM (Dynamic Random Access Memory) or SRAM (Static Random Access Memory), ESD (electrostatic discharge) usually causes damage to the IC's internal circuitry. A person who walks on a carpet under the condition of high relative humidity (RH), for example, will carry several hundreds to several thousands volts of electrostatic charge on his/her body. It can increase to more than ten thousand volts of electrostatic charge under the condition of low relative humidity. The fabrication and testing equipment in semiconductor factory, for example, will carry several hundreds to several thousands volts of electrostatic charge.

When electrostatic charge comes in contact with an IC chip, ESD will be discharged to the IC chip, consequently causing damage to the IC's internal circuitry. To prevent ESD damage to the internal circuitry, various kinds of ESD protection circuits have been proposed, such as the one shown in FIG. 1. As shown, the NMOS 102 is connected in such a manner that its drain is connected to the power line VDD, while its gate, source, and substrate are all connected to the ground line VSS (ground line will represent VSS in the diagram). When no ESD occurs between the power line VDD and the ground line and since the gate of the NMOS 102 is connected to the ground, the NMOS 102 is in the switch-off state, thereby allowing no current leakage to flow therethrough. On the other hand, in the event of ESD between the power line VDD and the ground line, the resulted ESD voltage will be imposed on the drain of the NMOS 102; and if this ESD voltage exceeds the breakdown voltage between the drain and substrate of the NMOS 102, it will cause breakdown at the drain-substrate junction of the NMOS 102 and then turns on the parasitic BJT, consequently allowing the NMOS 102 to bypass the ESD current through parasitic BJT path. Therefore, the IC's device (i.e., MOS 104) as well as the IC's internal circuitry 108 are prevented from ESD damage.

However, as IC fabrication technology advances to downsized integration, the gate oxide thickness 106 in the MOS 104 shown in FIG. 1 are correspondingly downsized to a smaller thickness, thus reducing the breakdown voltage of their gate oxide layers 106. If the breakdown voltage of the gate oxide layers 106 of the MOS 104 is reduced to a level substantially equal to the breakdown voltage of the junction of the ESD-bypassing NMOS 102, it will undesirably allow the ESD voltage to breakdown the gate oxide layers 106 of the MOS 104, thus causing damage to the MOS 104.

SUMMARY OF THE INVENTION

It is therefore an objective of this invention to provide a power-rail ESD protection circuit with a dual trigger design applied to the substrate and gate of the ESD-bypassing MOS device to reduce the triggering voltage needed in the parasitic BJT path in the ESD-bypassing MOS device so as to prevent ESD damage to the IC's internal circuitry, and increase ESD robustness.

The power-rail ESD protection circuit of the invention is coupled between a first power line and a second power line for protecting the IC device against ESD on the first power line and the second power line. The power-rail ESD protection circuit of the invention comprises a control circuit and at least one MOS device. The control circuit is coupled between the first power line and the second power line, and which is capable of, in the event of ESD in the first power line and the second power line, being triggered by the ESD to output a substrate-triggering voltage and a gate-driving voltage to the MOS device, causing the MOS device to bypass the ESD current from the first power line and the second power line according to the gate-driving voltage. The circuit configuration of the power-rail ESD protection circuit of the invention can help to reduce the triggering voltage needed in the parasitic BJT path and increase the ESD robustness.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 2:
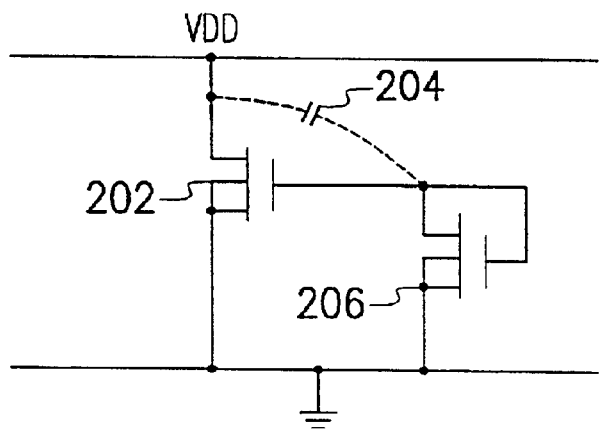
FIG. 2 (PRIOR ART) is a schematic diagram showing the circuit structure of a conventional gate-coupled ESD protection circuit.

FIG. 2 is a schematic diagram showing the circuit structure of a conventional gate-coupled ESD protection circuit. As shown in FIG. 2, this ESD protection circuit includes a gate-coupled NMOS 202 (these NMOS devices can also be replaced by PMOS devices) and a parasite capacitor 204 between the drain and the gate of the NMOS 202. When ESD occurs between the power line VDD and the ground line, due to the structure of the parasite capacitor 204 and the NMOS 206, they will provide a voltage to the gate of the NMOS 202, which can help lower the junction breakdown voltage at the drain of the NMOS 202.

Figure 1:
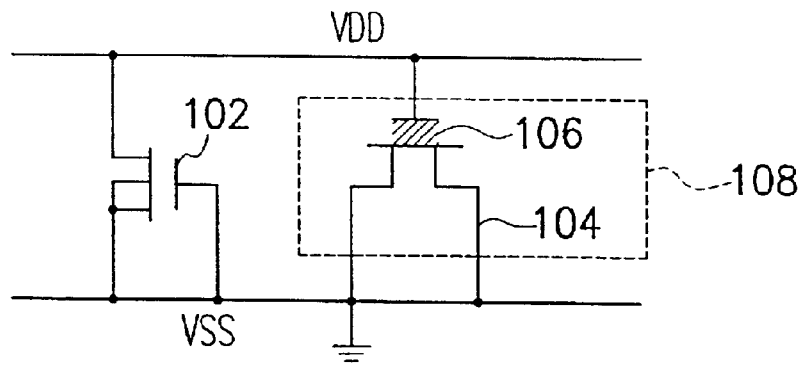
FIG. 1 (PRIOR ART) is a schematic diagram showing the circuit structure of a conventional gate-grounded ESD protection circuit.
Figure 3:
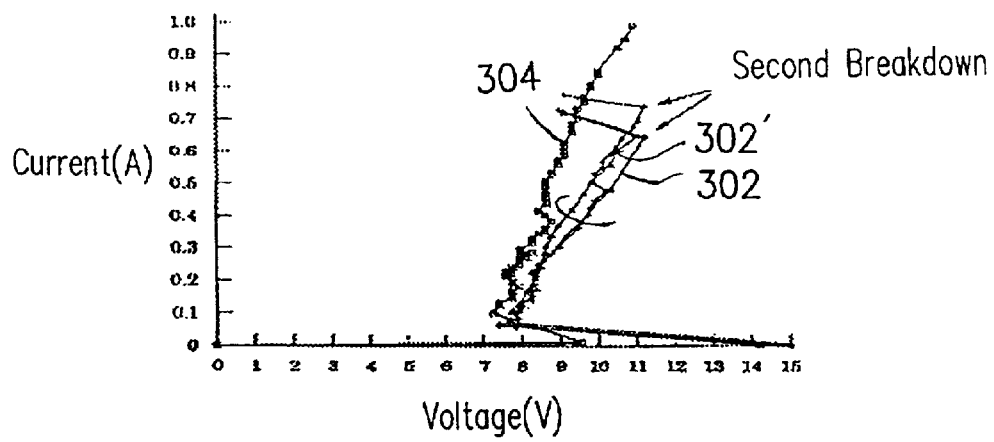
FIG. 3 (PRIOR ART) is a graph showing the ESD V-I characteristics of the gate-grounded and gate-coupled ESD protection circuits fabricated by 1.6-$\mu$m LDD technology.

FIG. 3 is a graph showing the ESD I-V characteristics of the gate-grounded and gate-coupled ESD protection circuits fabricated by 1.6-$\mu$m LDD technology (for details, please refer to the technical paper "DYNAMIC GATE COUPLING OF NMOS FOR EFFICIENT OUTPUT ESD PROTECTION", by C. Duvvury and C. Diaz, Proc. Of IRPS, pp. 141–150, 1992). In FIG. 3, the curves 302, 302' represent the ESD V-I characteristic of the gate-grounded circuit shown in FIG. 1, shows that in the event of ESD between the power line VDD and ground line, the gate-grounded circuit shown in FIG. 1 has a junction breakdown voltage of 15 V, and its maximum withstandable ESD current is 0.8 A. Further, the curve 304 represents the ESD V-I characteristic of the gate-coupled circuit shown in FIG. 2, which shows that in the event of ESD between the power line VDD and ground line, the gate-coupled circuit shown in FIG. 2 will have a junction breakdown voltage of only 9.5 V, but its maximum withstandable ESD current will be more than 1.0 A. Therefore, in the event of ESD between the power line VDD and ground line, the junction breakdown voltage is lower in the gate-coupled circuit shown in FIG. 2 than the gate-grounded one shown in FIG. 1 and the ESD robustnessness is better in the gate-coupled circuit shown in FIG. 2 than the gate-grounded one shown in FIG. 1.

Figure 4:
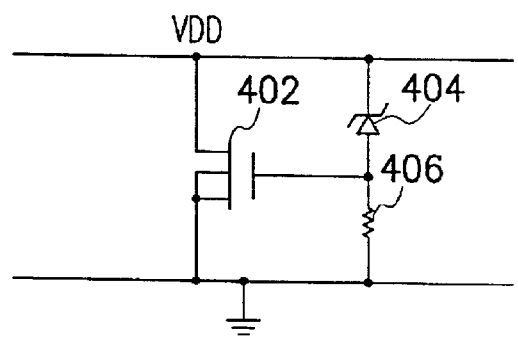
FIG. 4 (PRIOR ART) is a schematic diagram showing the circuit structure of a conventional gate-driven ESD protection circuit.

FIG. 4 is a schematic diagram showing the circuit structure of a conventional gate-driven ESD protection circuit. As shown in FIG. 4, this ESD protection circuit includes an NMOS 402 (which can also be implemented by PMOS), a Zener diode 404, and a resistor 406. In the event of ESD between the power line VDD and ground line, the Zener diode 404 will breakdown and thereby cause an electric current to flow through the resistor 406, resulting in a potential to the gate of the NMOS 402. This potential will cause a decrease in the junction breakdown voltage at the drain of the NMOS 402. Therefore, the gate-driven circuit shown in FIG. 4 will have the same characteristic as the gate-coupled circuit shown in FIG. 2 (i.e., a lower junction breakdown voltage and better ESD robustness).

Figure 5:
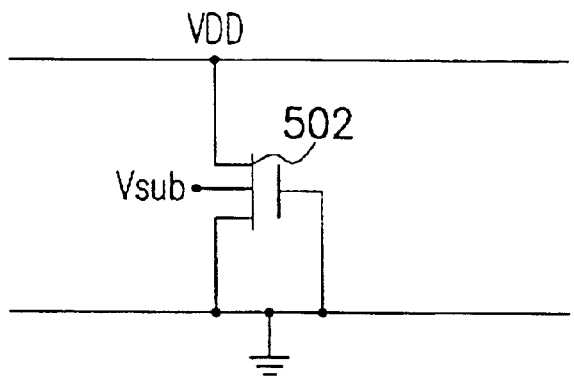
FIG. 5 (PRIOR ART) is a schematic diagram showing the circuit structure of a conventional gate-grounded and substrate-biased ESD protection circuit.
Figure 6:
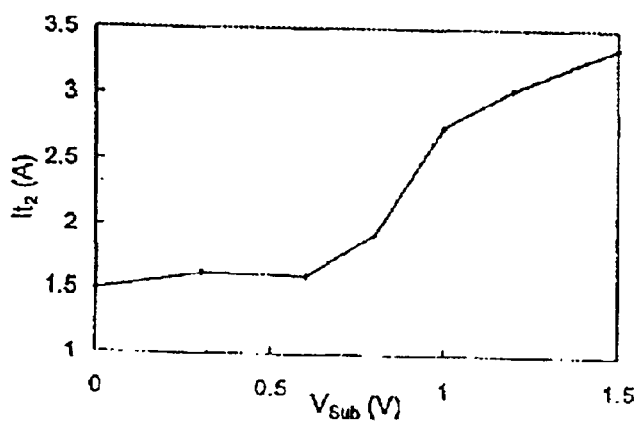
FIG. 6 (PRIOR ART) is a graph showing the ESD V-I characteristic of the gate-grounded and substrate-biased ESD protection circuit fabricated by 0.6-$\mu$m CMOS technology.

FIG. 5 is a schematic diagram showing the circuit structure of a conventional gate-grounded and substrate-biased ESD protection circuit. As shown in FIG. 5, this ESD protection circuit includes an NMOS 502, and which only differs from the circuit shown in FIG. 1 in that here a bias voltage $V_{sub}$ is applied to the substrate of the NMOS 502. FIG. 6 is a graph showing the bias voltage added ESD V-I characteristic of the gate-grounded and substrate-biased ESD protection circuit fabricated by 0.6-$\mu$m CMOS technology (for details, please refer to the technical paper "CMOS ON-CHIP ESD PROTECTION DESIGN WITH SUBSTRATE-TRIGGERING TECHNIQUE", by M. D. Ker, T. Y, Chen, and C. Y. Wu, on Proc. of ICECS, Vol. 1, pp. 273–276, 1998). As shown, In the event of ESD between the power line VDD and ground line, the bias voltage $V_{sub}$ will be raised from 0 V to 1 V, and the maximum withstandable ESD current $I_{t2}$ of the NMOS 502 will be increased from 1.5 A to 2.8 A. Therefore, the ESD robustness of the NMOS 502 is enhanced by increasing the bias voltage $V_{sub}$ applied to the substrate of the NMOS 502.

Figure 7A:
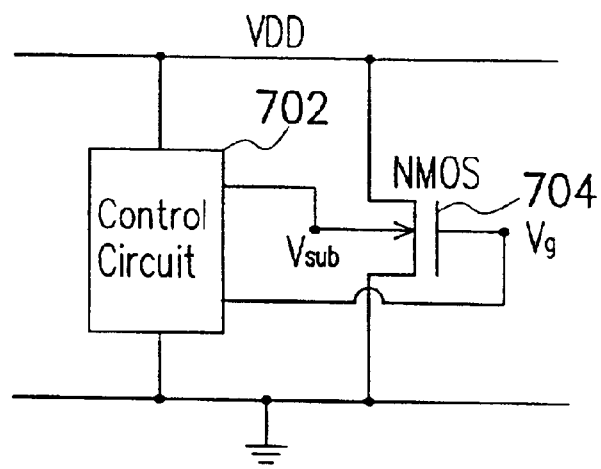
FIG. 7A is a schematic diagram showing the circuit architecture of an NMOS-based ESD protection circuit according to the invention.

The invention utilizes the characteristics of the above-mentioned circuits to provide a power-rail ESD protection circuit. FIG. 7A is a schematic diagram showing the basic circuit architecture of an NMOS-based ESD protection circuit according to the invention. As shown, this ESD protection circuit includes a control circuit 702 and an NMOS 704. The control circuit 702 is coupled between the power line VDD and the ground line. In the event of ESD between the power line VDD and ground line, it will trigger the control circuit 702 to output a substrate-triggering voltage $V_{sub}$ and a gate-driving voltage $V_g$. The NMOS 704 is connected in such a manner that its source and drain are connected to the power line VDD and the ground line, its gate is connected to receive the gate-driving voltage $V_g$, and its substrate is connected to receive the substrate-triggering voltage $V_{sub}$. In the event of ESD between the power line VDD and ground line, this circuit configuration allows a reduction in the junction breakdown voltage of the NMOS 704, thereby allowing the NMOS 704 to be switched on by a lower ESD voltage and to have a higher ESD robustness to bypass a larger ESD current.

Figure 7B:
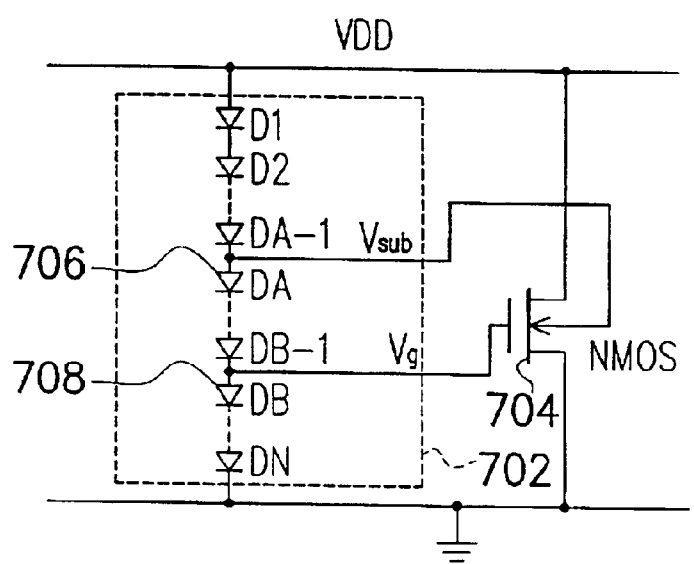
FIG. 7B is a schematic diagram showing a first example of the NMOS-based ESD protection circuit according to the invention.

The ESD protection circuit shown in FIG. 7A can be accomplished in various ways. FIG. 7B shows a first example of the NMOS-based ESD protection circuit according to the invention. As shown, in this first example, the control circuit 702 is composed of N serially-cascaded diodes D1–DN, with the positive end of the first diode D1 being connected to the power line VDD and the negative end of the last diode DN being connected to the ground line, and wherein the positive end of the (A)th diode DA 706 is connected to the substrate of the NMOS 704, and the positive end of the (B)th diode DB 708 is connected to the gate of the NMOS 704. Wherein, the N number of diodes can be formed by N number of NMOS (or PMOS), and they are connected in a manner where the drain and the gate are connected together, the source and substrate are connected together (PMOS is connected in a way where the drain and the gate are connected together, and the source and substrate connected together). It will be further discussed in the diagrams.

During normal operation of the IC (not shown), the junction breakdown voltage of the NMOS 704 is greater than the system voltage of the power line VDD, which will be unable to switch on the NMOS 704. If each of the diodes D1–DN has a forward bias cut-in voltage of 0.7 V, the forward-bias voltage drop across these N diodes D1–DN will be N×0.7 V, which is greater than the system voltage of the power line VDD but lower than the breakdown voltage; and therefore, these N diodes D1–DN will not turn on and cause current leakage.

In the event of ESD between the power line VDD and ground line, since the ESD voltage will be greater than the total forward voltage drop across the N diodes D1–DN, it will cause the N diodes D1–DN to turn on. The substrate-triggering voltage $V_{sub}$ applied to the substrate of the NMOS 704 is fetched from the positive end of the (A)th diode 706, while the gate-driving voltage $V_g$ applied to the gate of the NMOS 704 is fetched from the positive end of the (B)th diode 708; and therefore, the substrate-triggering voltage $V_{sub}$ is greater than the gate-driving voltage $V_g$. Therefore, based on the substrate-triggering voltage $V_{sub}$ and the gate-driving voltage $V_g$, the junction breakdown voltage of the NMOS 704 can be reduced in and ESD robustness can be increased, allowing the ESD current from the power line VDD and the ground line to bypass through the NMOS 704. In addition, the N diodes D1–DN also can bypass the ESD current. Alternatively, these N diodes D1–DN instead can be implemented by N NMOS devices, each NMOS having its drain and gate tied together and its source and substrate tied together. Details will be described later in drawings.

Figure 7C:
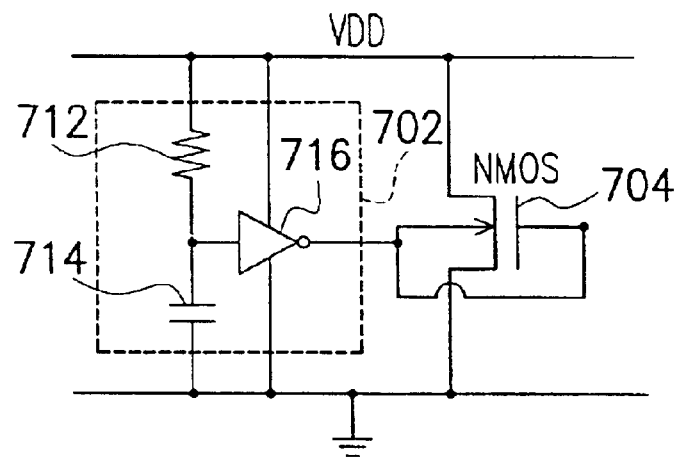
FIG. 7C is a schematic diagram showing a second example of the NMOS-based ESD protection circuit according to the invention.

FIG. 7C is a schematic diagram showing a second example of the NMOS-based ESD protection circuit according to the invention. As shown, in this example, the control circuit 702 is composed of a resistor 712, a capacitor 714, and an inverter 716. The resistor 712 has one end connected to the power line VDD and the other end connected both to the capacitor 714 and the input end of the inverter 716. The capacitor 714 has one end connected to the resistor 712 and the other end connected to the ground line. The inverter 716 has a first power port connected to the power line VDD, a second power port connected to the ground line, an input port connected to the node where the resistor 712 and the capacitor 714 are connected, and an output port connected to both the gate and substrate of the NMOS 704.

During normal operation of the IC (not shown), the junction breakdown voltage of the NMOS 704 is greater than the system voltage on the power line VDD, which is unable to switch on the NMOS 704. As a result, the system voltage VDD will charge the capacitor 714, causing the inverter 716 to output zero voltage 0 V to both the substrate and the gate of the NMOS 704. This allows the NMOS 704 to retain its original junction breakdown voltage. Further, the time constant of the RC circuit composed of the resistor 712 and the capacitor 714 is typically set at 0.1 μs to 1.0 μs (microsecond). The impulses produced at power-on typically have a duration of several milliseconds. Therefore, the preset time constant for the resistor 712 and capacitor 714 will allow the inverter 716 to instantly output zero voltage 0 V to both the substrate and the gate of the NMOS 704, allowing the NMOS 704 to quickly retain its original junction breakdown voltage, and there is few leakage under this condition.

In the event of ESD between the power line VDD and ground line, since the ESD time constant is typically several nanoseconds (ns), which is far less than the time constant of the RC circuit composed of the resistor 712 and the capacitor 714, and since ESD voltage is greater than the system voltage on the power line VDD, the capacitor 714 will be unable to promptly respond to the instant ESD voltage and therefore causes the input port of the inverter 716 to be substantially grounded. As a result, the instant ESD voltage will cause the inverter 716 to output a voltage to both the substrate and the gate of the NMOS 704. This causes the substrate-triggering voltage $V_{sub}$ applied to the substrate of the NMOS 704 to be equal to the gate-driving voltage $V_g$ applied to the gate of the NMOS 704. Therefore, based on the substrate-triggering voltage $V_{sub}$ and the gate-driving voltage $V_g$, the junction breakdown voltage of the NMOS 704 can be reduced and ESD robustness can be increased. As a result, the ESD current from the power line VDD and the ground line can bypass through the NMOS 704.

Figure 7D:
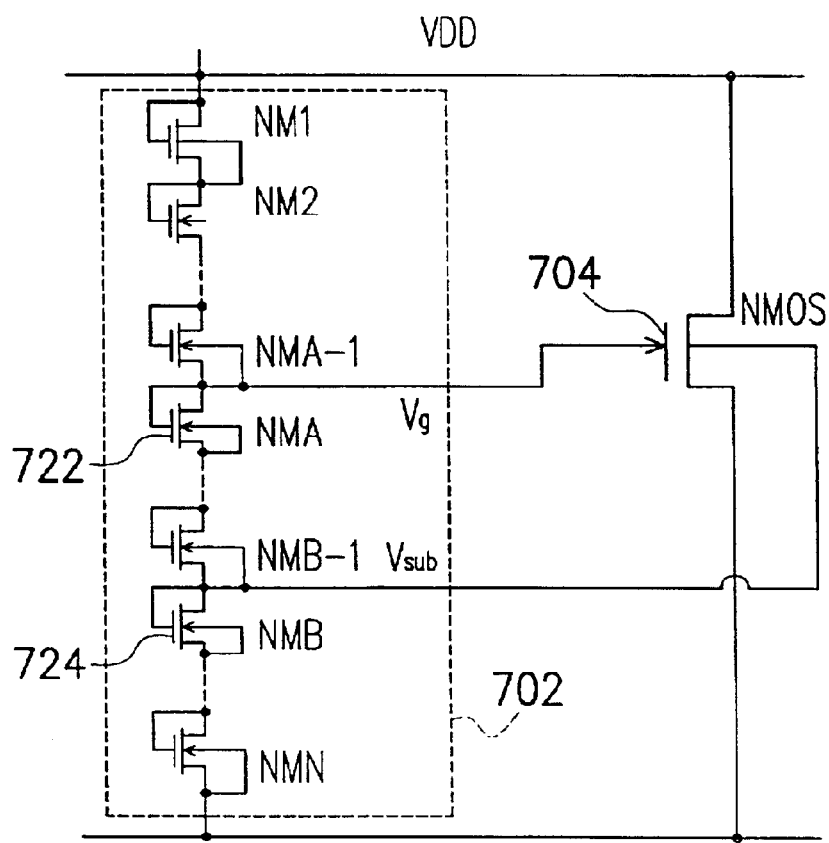
FIG. 7D is a schematic diagram showing a third example of the NMOS-based ESD protection circuit according to the invention.

FIG. 7D is a schematic diagram showing a third example of the NMOS-based ESD protection circuit according to the invention. As shown, in this example, the control circuit 702 is composed of N serially-cascaded NMOS devices NM1–NMN, and wherein the (A)th NMOS 722 has its drain connected to the gate of the NMOS 704, and the (B)th NMOS 724 has its drain connected to the substrate of the NMOS 704. Moreover, each of the NMOS devices NM1–NMN is connected in such a manner that its source is tied to its substrate, its drain is tied to its gate and connected to the source of the previous NMOS. This circuit configuration allows these NMOS devices NM1–NMN to function equivalently as diodes.

During normal operation of the IC (not shown), the junction breakdown voltage of the NMOS 704 is greater than the system voltage on the power line VDD, which is unable to switch on the NMOS 704. If each of the N NMOS devices NM1–NMN has a threshold voltage of $V_t$, the total voltage drop across these N NMOS devices NM1–NMN will be N×$V_t$, which is greater than the system voltage on the power line VDD; and therefore, these NMOS will not turn on and cause current leakage.

In the event of ESD between the power line VDD and ground line, since the ESD voltage will be greater than the total voltage drop across the N NMOS devices NM1–NMN, it will cause these N NMOS devices NM1–NMN to be switched on. The substrate-triggering voltage $V_{sub}$ applied to the substrate of the NMOS 704 is fetched from the drain of the (B)th NMOS 724, while the gate-driving voltage $V_g$ applied to the gate of the NMOS 704 is fetched from the (A)th NMOS 722; and therefore, the substrate-triggering voltage $V_{sub}$ is less than the gate-driving voltage $V_g$. Therefore, based on the substrate-triggering voltage $V_{sub}$ and the gate-driving voltage $V_g$, the junction breakdown voltage of the NMOS 704 can be reduced and ESD robustness can be increased. As a result, the ESD current from the power line VDD and the ground line can bypass through the NMOS 704. In addition, the N NMOS devices NM1–NMN also can bypass the ESD current because the voltage of the N NMOS devices N×$V_t$ is smaller than the junction breakdown voltage of the NMOS 704.

Alternatively, the ESD-bypassing NMOS 704 shown in FIG. 7A can be implemented by a PMOS, whose circuit configuration is disclosed in the following. Note that the control circuit is also labeled with the same reference numeral 702.

Figure 8A:
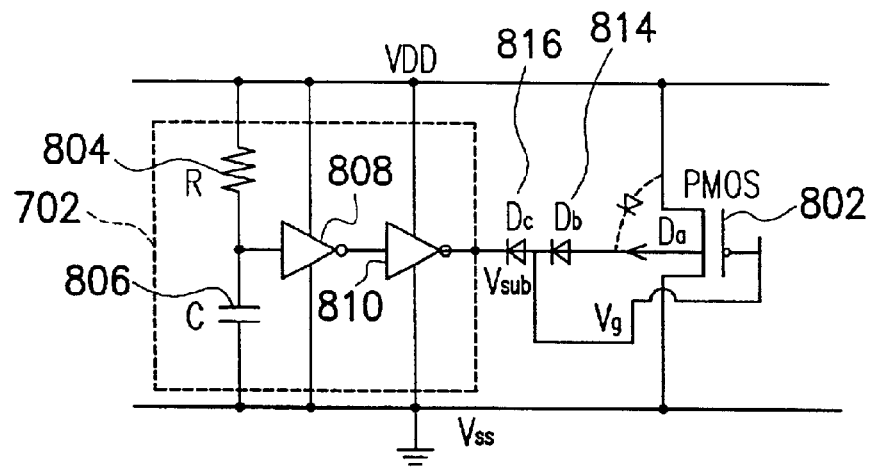
FIG. 8A is a schematic diagram showing a first example of the PMOS-based ESD protection circuit according to the invention.

FIG. 8A is a schematic diagram showing a first example of the PMOS-based ESD protection circuit according to the invention. As shown, in this example, the control circuit 702 is composed of a resistor 804, a capacitor 806, a first inverter 808, a second inverter 810, a first diode 814, and a second diode 816. The resistor 804 has a first end connected to the power line VDD and a second end connected to both the capacitor 806 and the input port of the first inverter 808. The capacitor 806 has one end connected to the second end of the resistor 804 and the other end connected to the ground line. The first inverter 808 has a first power port connected to the power line VDD, a second power port connected to the ground line, an input port connected to the node where the resistor 804 and the capacitor 806 are connected, and an output port connected to the input port of the second inverter 810. The second inverter 810 has a first power port connected to the power line VDD, a second power port connected to the positive end of the first diode 814, an input port connected to the output port of the first inverter 808, and an output port connected to the negative end of the second diode 816. The first diode 814 has a positive end connected to the substrate of the PMOS 802 and a negative end connected to both the positive end of the second diode 816 and the gate of the PMOS 802. The second diode 816 has a positive end connected to the negative end of the first diode 814, a negative end connected to the output of the second inverter 810.

During normal operation of the IC (not shown), the junction breakdown voltage of the PMOS 802 is greater than the system voltage on the power line VDD, which is unable to switch on the PMOS 802. As a result, the system voltage VDD will charge the capacitor 806, causing the first inverter 808 to output zero voltage 0 V to the input port of the second inverter 810, which then causes the second inverter 810 to produce an output voltage equal to VDD to the substrate of the PMOS 802. Meanwhile, since the gate of the PMOS 802 is connected to the positive end of the second diode 816 where the potential is near VDD, it will allow the PMOS 802 to retain its original junction breakdown voltage. Further, the time constant of the RC circuit composed of the resistor 804 and the capacitor 806 is typically set at 0.1 $\mu$s to 1.0 $\mu$s (microsecond). The impulses produced at power-on typically have a duration of several milliseconds. Therefore, the preset time constant for the resistor 804 and capacitor 806 will allow the second inverter 810 to instantly output the VDD voltage to the substrate of the PMOS 802, allowing the PMOS 802 to quickly retain its original junction breakdown voltage.

In the event of ESD between the power line VDD and ground line, since the ESD time constant is typically several nanoseconds (ns), which is far less than the time constant of the RC circuit composed of the resistor 804 and the capacitor 806 and since ESD voltage is greater than the system voltage on the power line VDD, the capacitor 806 will be unable to promptly respond to the instant ESD voltage and therefore causes the input port of the first inverter 808 to be substantially grounded. As a result, the instant ESD voltage will cause the first inverter 808 to output a voltage equal to VDD to the input port of the second inverter 810, causing the second inverter 810 to output zero voltage to the substrate of the PMOS 802. As a result, a current $D_a$ from the parisitic diode of PMOS 802 will flow during the ESD pulse to the first inverter 814 becoming $D_b$, then to the second inverter 816 becoming $D_c$, and back to the second inverter 810. This will induce triggering voltages $V_{sub}$ and $V_g$ where the substrate-triggering voltage $V_{sub}$ applied to the substrate of the PMOS 802 is greater than the gate-driving voltage $V_g$ applied to the gate of the PMOS 802. Therefore, based on the substrate-triggering voltage $V_{sub}$ and the gate-driving voltage $V_g$, the junction breakdown voltage in PMOS 802 can be reduced and ESD robustness can be increased. As a result, the ESD current from the power line VDD and the ground line can bypass through the PMOS 802.

Figure 8B:
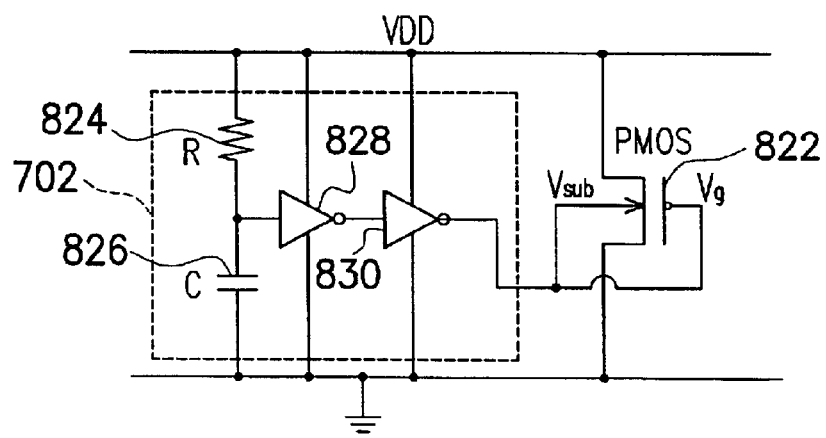
FIG. 8B is a schematic diagram showing a second example of the PMOS-based ESD protection circuit according to the invention.

FIG. 8B is a schematic diagram showing a second example of the PMOS-based ESD protection circuit according to the invention. As shown, in this example, the control circuit 702 is composed of a resistor 824, a capacitor 826, a first inverter 828, and a second inverter 830. The resistor 824 has a first end connected to the power line VDD and a second end connected to both the capacitor 826 and the input port of the first inverter 828. The capacitor 826 has one end connected to the second end of the resistor 824 and the other end connected to the ground line. The first inverter 828 has a first power port connected to the power line VDD, a second power port connected to the ground line, an input port connected to the node where the resistor 824 and the capacitor 826 are connected, and an output port connected to the input port of the second inverter 830. The second inverter 830 has a first power port connected to the power line VDD, a second power port connected to the ground line, an input port connected to the output port of the first inverter 828, and an output port connected to both the substrate and the gate of the PMOS 822.

During normal operation of the IC (not shown), the junction breakdown voltage of the PMOS 822 is greater than the system voltage on the power line VDD, which is unable to switch on the PMOS 822. As a result, the system voltage VDD will charge the capacitor 826, causing the first inverter 828 to output zero voltage 0 V to the input port of the second inverter 830, which then causes the second inverter 830 to produce an output voltage equal to VDD to both the substrate and the gate of the PMOS 822. This allows the PMOS 822 to retain its original junction breakdown voltage. Further, the time constant of the RC circuit composed of the resistor 824 and the capacitor 826 is typically set at 0.1 $\mu$s to 1.0 $\mu$s (microsecond). The impulses produced at power-on typically have a duration of several milliseconds. Therefore, the preset time constant for the resistor 824 and capacitor 826 will allow the second inverter 830 to instantly output the VDD voltage to both the substrate and the gate of the PMOS 822, allowing the PMOS 822 to quickly retain its original junction breakdown voltage.

In the event of ESD between the power line VDD and ground line, since the ESD time constant is typically several nanoseconds (ns), which is far less than the time constant of the RC circuit composed of the resistor 824 and the capacitor 826, and since ESD voltage is greater than the system voltage on the power line VDD, the capacitor 826 will be unable to promptly respond to the instant ESD voltage and therefore at this instant still cause the input port of the first inverter 808 to be substantially grounded. As a result, the instant ESD voltage will cause the first inverter 828 to output a voltage to the input port of the second inverter 830, causing the second inverter 830 to output zero voltage 0 V to both the substrate and the gate of the PMOS 822. In other words the substrate-triggering voltage $V_{sub}$ is equal to the gate-driving voltage $V_g$. Therefore based on the substrate-triggering voltage $V_{sub}$ and the gate-driving voltage $V_g$, the junction breakdown voltage in PMOS 822 can be reduced and ESD robustness can be increased. As a result, the ESD current from the power line VDD and the ground line can bypass through the PMOS 822.

Figure 8C:
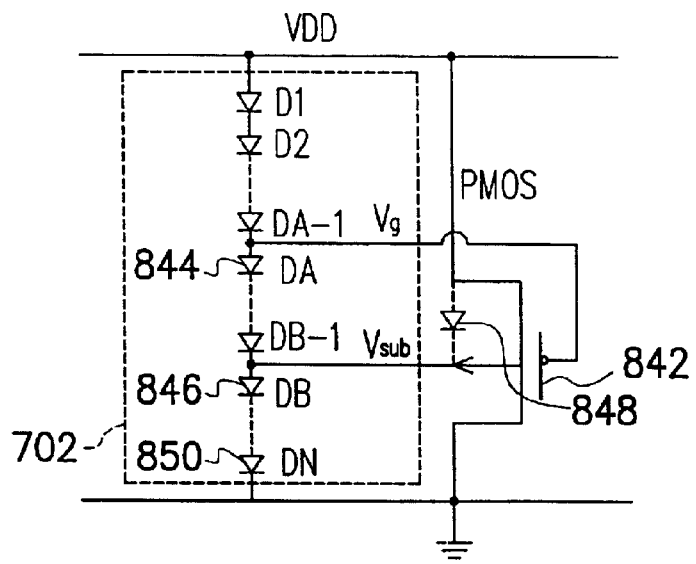
FIG. 8C is a schematic diagram showing a third example of the PMOS-based ESD protection circuit according to the invention.

FIG. 8C is a schematic diagram showing a third example of the PMOS-based ESD protection circuit according to the invention. As shown, in this first example, the control circuit 702 is composed of N serially-cascaded diodes D1–DN, and wherein the positive end of the (A)th diode DA 844 is connected to the gate of the PMOS 842, and the positive end of the (B)th diode DB 846 is connected to the substrate of the PMOS 842.

During normal operation of the IC (not shown), the junction breakdown voltage of the PMOS 842 is greater than the system voltage on the power line VDD, which is unable to switch on the PMOS 842. If each of the diodes D1–DN has a forward bias cut-in voltage of 0.7 V, the forward-bias voltage drop across these N diodes D1–DN will be N×0.7 V, which is greater than the system voltage on the power line VDD; and therefore, these N diodes D1–DN will turn on and cause current leakage.

In the event of ESD between the power line VDD and ground line, since the ESD voltage will be greater than the total forward voltage drop across the N diodes D1–DN, it will cause the N diodes D1–DN to be turned on. The substrate-triggering voltage $V_{sub}$ applied to the substrate of the PMOS 842 is fetched from the positive end of the (B)th diode DB 846, while the gate-driving voltage $V_g$ applied to the gate of the PMOS 842 is fetched from the (A)th diode DA 844, and therefore, the substrate-triggering voltage $V_{sub}$ is smaller than the gate-driving voltage $V_g$. Therefore, based on the substrate-triggering voltage $V_{sub}$ and the gate-driving voltage $V_g$ the junction breakdown voltage in PMOS 842 can be reduced and ESD robustness can be increased. As a result, the ESD current from the power line VDD and the ground line can bypass through the PMOS 842. In addition, the N diodes D1–DN also can bypass the ESD current. Alternatively, these N diodes D1–DN instead can be implemented by N NMOS devices, each NMOS having its drain and gate tied together and its source and substrate tied together.

Figure 9A:
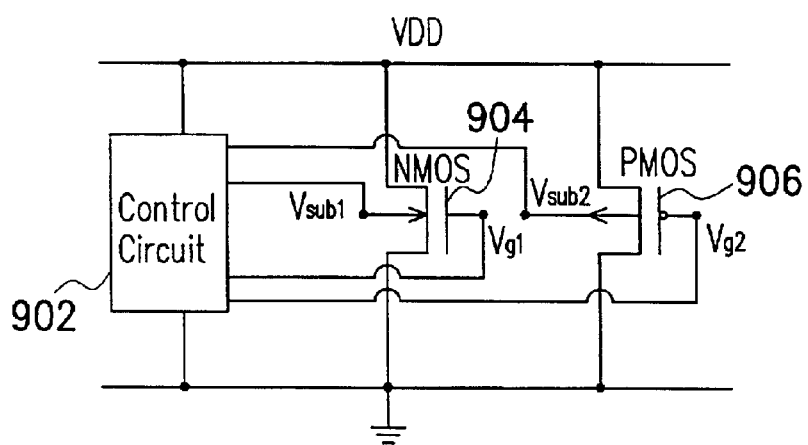
FIG. 9A is a schematic diagram showing the basic circuit architecture of a PMOS/NMOS-based ESD protection circuit according to the invention.

Further, FIG. 9A shows the basic circuit architecture of a PMOS/NMOS-based ESD protection circuit according to the invention, which is implemented by cascading an additional PMOS to the ESD protection circuit shown in FIG. 7A. As shown, this PMOS/NMOS-based ESD protection circuit includes a control circuit 902, an NMOS 904, and a cascaded PMOS 906. The control circuit 902 is coupled between the power line VDD and the ground line. In the event of ESD between the power line VDD and ground line, it will trigger the control circuit 902 to output a first substrate-triggering voltage $V_{sub1}$, a second substrate-triggering voltage $V_{sub2}$, a first gate-driving voltage $V_{g1}$, and a second gate-driving voltage $V_{g2}$. The NMOS 904 is connected in such a manner that its source and drain are connected between the power line VDD and the ground line, its gate is connected to receive the first gate-driving voltage $V_{g1}$, and its substrate is connected to receive the first substrate-triggering voltage $V_{sub1}$. The PMOS 906 is connected in such a manner that its source and drain are connected between the power line VDD and the ground line, its gate is connected to receive the second gate-driving voltage $V_{g2}$, and its substrate is connected to receive the second substrate-triggering voltage $V_{sub2}$. This circuit configuration reduces the junction breakdown voltage of the NMOS 904 and the PMOS 906, thereby allowing the NMOS 904 and the PMOS 906 to be switched on by a lower ESD voltage and to have a higher ESD robustness to withstand a larger ESD current.

Figure 9B:
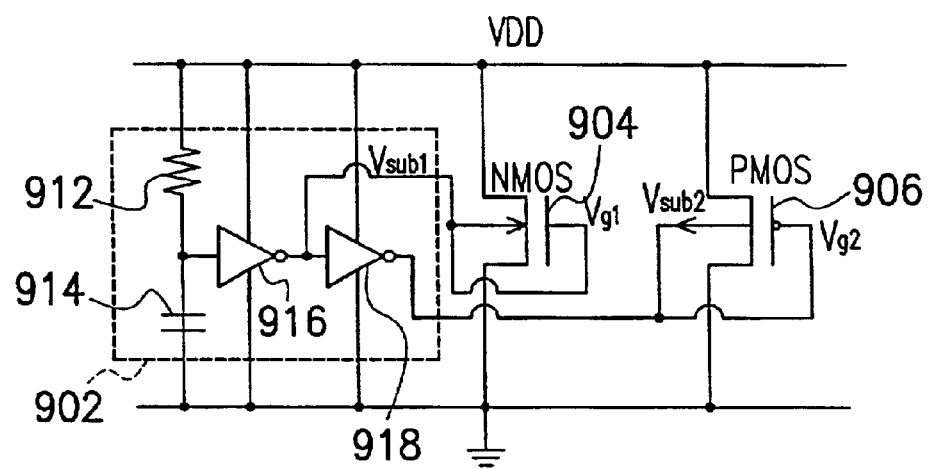
FIG. 9B is a schematic diagram showing detailed circuit structure of an example of the PMOS/NMOS-based ESD protection circuit according to the invention.

FIG. 9B is a schematic diagram showing a detailed circuit structure of an example of the PMOS/NMOS-based ESD protection circuit according to the invention. As shown, in this example, the control circuit 902 is composed of a resistor 912, a capacitor 914, a first inverter 916, and a second inverter 918. The resistor 912 has a first end connected to the power line VDD and a second end connected to both the capacitor 914 and the input port of the first inverter 916. The capacitor 914 has one end connected to the second end of the resistor 912 and the other end connected to the ground line. The first inverter 916 has a first power port connected to the power line VDD, a second power port connected to the ground line, an input port connected to the node where the resistor 912 and the capacitor 914 are connected, and an output port connected to the input port of the second inverter 918 as well as to both the substrate and the gate of the NMOS 904. The second inverter 918 has a first power port connected to the power line VDD, a second power port connected to the ground line, an input port connected to the output port of the first inverter 916, and an output port connected to both the substrate and the gate of the PMOS 906.

During normal operation of the IC (not shown), the junction breakdown voltage of the NMOS 904 and that of the PMOS 906 are both greater than the system voltage on the power line VDD, which is unable to switch on the NMOS 904 and the PMOS 906. As a result, the system voltage VDD will charge the capacitor 914, causing the first inverter 916 to output zero voltage 0 V to the input port of the second inverter 916 as well as to both the substrate and the gate of the NMOS 904, which then causes the second inverter 918 to produce an output voltage equal to VDD to both the substrate and the gate of the PMOS 906. This allows both the NMOS 904 and the PMOS 906 to retain their original junction breakdown voltages. Further, the time constant of the RC circuit composed of the resistor 912 and the capacitor 914 is typically set at 0.1 μs to 1.0 μs (microsecond). The impulses produced at power-on typically have a duration of several milliseconds. Therefore, the preset time constant for the resistor 912 and the capacitor 914 will allow the first inverter 916 to instantly output zero voltage 0 V to the input port of the second inverter 918 as well as to both the substrate and the gate of the NMOS 904, and further allow the second inverter 918 to promptly output VDD to both the substrate and the gate of the PMOS 906. This allows both the NMOS 904 and the PMOS 906 to quickly retain their original junction breakdown voltages.

In the event of ESD between the power line VDD and ground line, since the ESD time constant is typically several nanoseconds (ns), which is far less than the time constant of the RC circuit composed of the resistor 912 and the capacitor 914, and since ESD voltage is greater than the system voltage on the power line VDD, the capacitor 914 will be unable to promptly respond to the instant ESD voltage and therefore at this instant still cause the input port of the first inverter 916 to be substantially grounded. As a result, the instant ESD voltage will cause the first inverter 916 to output a voltage to the input port of the second inverter 918 as well as to both the substrate and the gate of the NMOS 904, consequently causing the second inverter 918 to output zero voltage 0 V to both the substrate and the gate of the PMOS 906. In other words, the substrate-triggering voltage $V_{sub1}$ applied to the substrate of the NMOS 904 is equal to the gate-driving voltage $V_{g1}$ applied to the gate of the NMOS 904; and the substrate-triggering voltage $V_{sub2}$ applied to the substrate of the PMOS 906 is equal to the gate-driving voltage $V_{g2}$ applied to the gate of the PMOS 906. Therefore, based on the substrate-triggering voltage $V_{sub1}$ and the gate-driving voltage $V_{g1}$ applied to the NMOS 904 and the substrate-triggering voltage $V_{sub2}$ and the gate-driving voltage $V_{g2}$ applied to the PMOS 906, both the junction breakdown voltage in NMOS 904 and the PMOS 906 can be reduced and ESD robustness can be increased, allowing the ESD current from the power line VDD and the ground line to bypass through the NMOS 904 and the PMOS 906.

In conclusion, the ESD protection circuit according to the invention has the following advantages. First, the invention can help reduce the junction breakdown voltage of the MOS that is used to bypass ESD current to the ground so as to protect IC's input buffer and internal circuitry from being damaged by ESD. Second, the invention can help increase the ESD robustness of the ESD-bypassing MOS, so that it can withstand a larger ESD current.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A power-rail ESD protection circuit with a dual trigger design, which is coupled between a first power line and a second power line connected to an IC device for protecting the IC device against ESD on the first power line and the second power line;

the power-rail ESD protection circuit comprising:

a control circuit, which is coupled between the first power line and the second power line, and which is capable of, in the event of ESD in the first power line and the second power line, being triggered by the ESD to output a substrate-triggering voltage and a gate-driving voltage; and a NMOS device, whose source and drain are respectively connected to the first power line and the second power line, whose substrate is coupled to receive the substrate-triggering voltage, and whose gate is coupled to receive the gate-driving voltage, for bypassing ESD current from the first power line and the second power line, wherein the control circuit includes N serially-cascaded diodes, wherein the positive end of the first diode is connected to the first power line and the negative end of the last diode is connected to the second power line, and wherein the positive end of the (A)th diode is connected to the substrate of the NMOS device, and the positive end of the (B)th diode is connected to the gate of the NMOS device, where A and B are predetermined to allow the positive end of the (A)th diode to supply the substrate-triggering voltage and the positive end of the (B)th diode to supply the gate-driving voltage; and wherein in the event of ESD in the first power line and the second power line, the substrate-triggering voltage applied to the substrate of the NMOS device is greater than the gate-driving voltage applied to the gate of the NMOS device.

2. The power-rail ESD protection circuit of claim 1, wherein the N serially-cascaded diodes are implemented by N NMOS devices, each NMOS device having its drain and gate tied together and its source and substrate tied together.

3. A power-rail ESD protection circuit with a dual trigger design, which is coupled between a first power line and a second power line connected to an IC device for protecting the IC device against ESD on the first power line and the second power line;

the power-rail ESD protection circuit comprising:
a control circuit, which is coupled between the first power line and the second power line, and which is capable of, in the event of ESD in the first power line and the second power line, being triggered by the ESD to output a substrate-triggering voltage and a gate-driving voltage; and a NMOS device, whose source and drain are respectively connected to the first power line and the second power line, whose substrate is coupled to receive the substrate-triggering voltage, and whose gate is coupled to receive the gate-driving voltage, for bypassing ESD current from the first power line and the second power line, wherein the control circuit includes N serially-cascaded diodes, wherein the positive end of the first diode is connected to the first power line and the negative end of the last diode is connected to the second power line, and wherein the positive end of the (A)th diode is connected to the substrate of the NMOS device, and the positive end of the (B)th diode is connected to the gate of the NMOS device, where A and B are predetermined to allow the positive end of the (A)th diode to supply the substrate-triggering voltage and the positive end of the (B)th diode to supply the gate-driving voltage, and the substrate-triggering voltage applied to the substrate of the NMOS device is smaller than the gate-driving voltage applied to the gate of the NMOS device.

4. The power-rail ESD protection circuit of claim 3, wherein the N serially-cascaded diodes are implemented by N NMOS devices, each NMOS device having its drain and gate tied together and its source and substrate tied together, or the N serially-cascaded diodes are implemented by N PMOS devices, each PMOS device having its drain and gate tied together and its source and substrate tied together.

5. A power-rail ESD protection circuit of with a dual trigger design, which is coupled between a first power line and a second power line connected to an IC device for protecting the IC device against ESD on the first power line and the second power line;

the power-rail ESD protection circuit comprising:
a control circuit, which is coupled between the first power line and the second power line, and which is capable of, in the event of ESD in the first power line and the second power line, being triggered by the ESD to output a substrate-triggering voltage and a gate-driving voltage; and a PMOS device, whose source and drain are respectively connected to the first power line and the second power line, whose substrate is coupled to receive the substrate-triggering voltage, and whose ante is coupled to receive the gate-driving voltage, for bypassing ESD current from the first power line and the second power line, wherein the control circuit includes N serially-cascaded diodes, wherein the positive end of the first diode is connected to the first power line and the negative end of the last diode is connected to the second power line, wherein the positive end of the (A)th diode is connected to the substrate of the PMOS device, and the positive end of the (B)th diode is connected to the gate of the PMOS, where A and B are predetermined to allow the positive end of the (A)th diode to supply the substrate-triggering voltage and the positive end of the (B)th diode to supply the gate-driving voltage; and wherein in the event of ESD in the first power line and the second power line, the substrate-triggering voltage applied to the substrate of the PMOS device is smaller than the gate-driving voltage applied to the gate of the PMOS device.

6. The power-rail ESD protection circuit of claim 5, wherein the N serially-cascaded diodes are implemented by N NMOS devices, each NMOS device having its drain and gate tied together and its source and substrate tied together.

* * * * *